United States Patent
Lam

(10) Patent No.: US 8,324,023 B2
(45) Date of Patent: Dec. 4, 2012

(54) STACKED-DIE ELECTRONICS PACKAGE WITH PLANAR AND THREE-DIMENSIONAL INDUCTOR ELEMENTS

(75) Inventor: Ken Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/088,296

(22) Filed: Apr. 15, 2011

(65) Prior Publication Data

US 2011/0193192 A1    Aug. 11, 2011

Related U.S. Application Data

(62) Division of application No. 11/457,409, filed on Jul. 13, 2006, now Pat. No. 7,932,590.

(51) Int. Cl.
*H01L 27/04* (2006.01)

(52) U.S. Cl. ............... 438/107; 257/E27.01; 257/E21.5; 257/531; 257/686

(58) Field of Classification Search .................. 438/107; 257/E27.01, E21.5, 531, 686
See application file for complete search history.

(56) References Cited

U.S. PATENT DOCUMENTS

| | | |
|---|---|---|
| 5,478,773 A | 12/1995 | Dow et al. |
| 5,541,135 A | 7/1996 | Pfeifer et al. |
| 6,008,102 A | 12/1999 | Alford et al. |
| 6,075,712 A | 6/2000 | McMahon |
| 6,091,144 A | 7/2000 | Harada |
| 6,407,456 B1 | 6/2002 | Ball |
| 6,444,517 B1 | 9/2002 | Hsu et al. |
| 6,486,530 B1 * | 11/2002 | Sasagawa et al. ............. 257/532 |
| 6,538,313 B1 | 3/2003 | Smith |
| 6,744,114 B2 | 6/2004 | Dentry et al. |
| 6,780,677 B2 | 8/2004 | Imasu et al. |
| 6,798,057 B2 | 9/2004 | Bolkin et al. |
| 6,884,658 B2 | 4/2005 | Akram |
| 6,890,829 B2 | 5/2005 | Cheng et al. |

(Continued)

FOREIGN PATENT DOCUMENTS

GB   2288074   10/1995

(Continued)

OTHER PUBLICATIONS

U.S. Appl. No. 11/456,685, Response filed Oct. 12, 2010 to Final Office Action mailed Aug. 9, 2010, 5 pgs.

(Continued)

*Primary Examiner* — Marc Armand
(74) *Attorney, Agent, or Firm* — Fish & Richardson P.C.

(57) ABSTRACT

An apparatus and a method for producing three-dimensional integrated circuit packages. In one embodiment, an electronics package with at least two dice are stacked one atop another is disclosed. A top die is of smaller size compared with a bottom die such that after a die attach operation, wire-bond pads of the bottom die will be exposed for a subsequent wire bonding operation. The bottom die contains contact pads on the front side that couple with one or more passive components fabricated on the back side of the top die to complete the circuit. In another exemplary embodiment, a method to form one or more three-dimensional passive components in a stacked-die package is disclosed wherein partial inductor elements are fabricated on the front side of the bottom die and the back side of the top die. The top and bottom elements are coupled together completing the passive component.

17 Claims, 4 Drawing Sheets

U.S. PATENT DOCUMENTS

| | | | |
|---|---|---|---|
| 7,142,000 | B2 | 11/2006 | Eldridge et al. |
| 7,239,025 | B2 | 7/2007 | Farrar |
| 7,335,994 | B2 | 2/2008 | Klein et al. |
| 7,497,005 | B2 | 3/2009 | Forbes et al. |
| 7,932,590 | B2 | 4/2011 | Lam |
| 2002/0086533 | A1 | 7/2002 | Jang et al. |
| 2003/0020171 | A1 | 1/2003 | Dutta et al. |
| 2003/0045044 | A1 | 3/2003 | Dentry et al. |
| 2003/0077871 | A1 | 4/2003 | Cheng et al. |
| 2004/0036569 | A1 | 2/2004 | Tsai et al. |
| 2004/0041270 | A1 | 3/2004 | Shimizu et al. |
| 2004/0178473 | A1 | 9/2004 | Dentry et al. |
| 2005/0002167 | A1 | 1/2005 | Hsuan et al. |
| 2005/0046041 | A1 | 3/2005 | Tsai |
| 2005/0127397 | A1 | 6/2005 | Borges et al. |
| 2005/0133916 | A1 | 6/2005 | Karnezos |
| 2005/0253257 | A1 | 11/2005 | Chiu et al. |
| 2006/0011702 | A1 | 1/2006 | Funaya et al. |
| 2006/0027841 | A1 | 2/2006 | Tamaki |
| 2006/0245308 | A1* | 11/2006 | Macropoulos et al. ........... 369/1 |
| 2006/0286716 | A1 | 12/2006 | Takayama |
| 2007/0138572 | A1 | 6/2007 | Lam |
| 2007/0138628 | A1 | 6/2007 | Lam |
| 2009/0294957 | A1 | 12/2009 | Lam |

FOREIGN PATENT DOCUMENTS

| | | | |
|---|---|---|---|
| WO | WO-00054337 | A1 | 9/2000 |
| WO | WO-2008008581 | A2 | 1/2008 |
| WO | WO-2008008581 | A3 | 1/2008 |
| WO | WO-2008008587 | A2 | 1/2008 |
| WO | WO-2008008587 | A3 | 1/2008 |

OTHER PUBLICATIONS

U.S. Appl. No. 11/456,685, Final Office Action mailed Aug. 9, 2010, 15 pgs.

U.S. Appl. No. 11/456,685, Response filed Jan. 30, 2009 to Notice of Non-Compliant Amendment mailed Dec. 30, 2009, 1 pg.

U.S. Appl. No. 11/456,685, Notice of Non-Compliant Amendment mailed Dec. 30, 2008, 3 pgs.

U.S. Appl. No. 11/457,409 Notice of Allowance mailed Aug. 4, 2010, 7 pgs.

U.S. Appl. No. 11/457,409, Response filed Jul. 19, 2010 to Non-final Office Action mailed Apr. 19, 2010, 8 pages.

U.S. Appl. No. 11/457,409, Non-final Office Action mailed Apr. 19, 2010, 5 pgs.

U.S. Appl. No. 11/457,409, Notice of Allowance mailed Dec. 30, 2009, 7 pgs.

U.S. Appl. No. 11/457,409, Final Office Action mailed Feb. 24, 2009, 15 pgs.

U.S. Appl. No. 11/457,409, Non-Final Office Action mailed Jul. 23, 2009, 13 pgs.

U.S. Appl. No. 11/457,409, Preliminary Amendment filed Oct. 13, 2006, 3 pgs.

U.S. Appl. No. 11/457,409, Response filed Feb. 25, 2008 to Restriction Requirement mailed Jan. 25, 2008, 7 pgs.

U.S. Appl. No. 11/457,409, Response filed Jun. 24, 2009 to Final Office Action mailed Feb. 24, 2009, 13 pgs.

U.S. Appl. No. 11/457,409, Response filed Jun. 27, 2008 mailed Mar. 31, 2008, 15 pgs.

U.S. Appl. No. 11/457,409, Response filed Dec. 1, 2008 to Restriction Requirement mailed Sep. 30, 2008, 8 pgs.

U.S. Appl. No. 11/457,409, Restriction Requirement mailed Jan. 25, 2008, 6 pgs.

U.S. Appl. No. 11/457,409, Restriction Requirement mailed Sep. 30, 2008, 6 pgs.

U.S. Appl. No. 11/457,409, Response filed Oct. 23, 2009 to Non-Final Office Action mailed Jul. 23, 2009, 10 pgs.

U.S. Appl. No. 11/457,409, Non-Final Office Action mailed Mar. 31, 2008, 19 pgs.

U.S. Appl. No. 11/305,084, Amendment and Response filed Jan. 5, 2009 to Non-Final Office Action mailed Aug. 5, 2008, 13 pgs.

U.S. Appl. No. 11/304,084, Non-Final Office Action mailed Aug. 5, 2008, 11 pgs.

U.S. Appl. No. 11/304,084, Amendment and Response filed May 21, 2008 to Final Office Action mailed Feb. 21, 2008, 12 pgs.

U.S. Appl. No. 11/304,084, Amendment and Response filed Jun. 27, 2008 mailed Mar. 31, 2008, 15 pgs.

U.S. Appl. No. 11/304,084, Final Office Action mailed Apr. 2, 2009, 10 pgs IDS Sep. 16, 2008 IDS Jun. 28, 2010 App.

U.S. Appl. No. 11/304,084, Response filed Jan. 5, 2009 to Non-Final Office Action mailed Aug. 5, 2008, 13 pgs.

U.S. Appl. No. 11/304,084, Response filed Apr. 17, 2007 to Restriction requirement mailed Apr. 5, 2007, 1 pg.

U.S. Appl. No. 11/304,084, Restriction Requirement mailed Apr. 5, 2007, 1 pg.

U.S. Appl. No. 11/304,084, Amendment and Response filed Nov. 9, 2007 to Non-Final Office Action mailed May 11, 2007, 15 pgs.

U.S. Appl. No. 11/304,084, Non-Final Office Action mailed May 11, 2007, 12 pgs.

U.S. Appl. No. 11/456,685, Non-Final Office Action mailed Nov. 22, 2010, 9 pages.

"U.S. Appl. No. 11/456,685, Notice of Non-Compliant Amendment mailed Nov. 17, 2009", 2 pgs.

"U.S. Appl. No. 11/456,685, Response filed Jan. 19, 2010 to Notice of Non-Compliant Amendment mailed Nov. 17, 2009", 8 pgs.

"U.S. Appl. No. 11/456,685, Response filed Aug. 25, 2009 to Election Requirement mailed Jun. 25, 2009", 8 pgs.

"U.S. Appl. No. 11/456,685, Restriction Requirement mailed Jun. 25, 2009", 5 pgs.

"U.S. Appl. No. 11/304,084, Final Office Action mailed Feb. 21, 2008", 11 pgs.

"U.S. Appl. No. 11/456,685, Non-Final office Action mailed May 14, 2008", 19 pgs.

"U.S. Appl. No. 11/456,685, Response filed Sep. 15, 2008 to Non-Final Office Action mailed May 14, 2008", 17 pgs.

"U.S. Appl. No. 11/456,685, Restriction Requirement mailed Mar. 28, 2008", 6 pgs.

"U.S. Appl. No. 11/456,685, Response filed Apr. 28, 2008 to Restriction Requirement mailed Mar. 28, 2008", 5 pgs.

"International Application Serial No. PCT/US2007/071079, International Search Report mailed May 16, 2008", 4 pgs.

"International Application Serial No. PCT/US2007/071079, Written Opinion mailed May 16, 2008", 5 pgs.

"PCT Application No. PCT/US07/70612, International Search Report mailed Apr. 21, 2008", 2 pgs.

"PCT Application No. PCT/US07/70612, Written Opinion Apr. 21, 2008", 10 pgs.

U.S. Appl. No. 11/456,685 Non-Final Office Action mailed Jul. 12, 2011, 8 pages.

U.S. Appl. No. 11/456,685, Notice of Allowance mailed May 2, 2012, 8 pages.

U.S. Appl. No. 11/456,685, Notice of Allowance mailed Jan. 9, 2012, 7 pages.

U.S. Appl. No. 12/534,819, Non-Final Office Action mailed Nov. 1, 2010, 15 pages.

U.S. Appl. No. 12/534,819, Final Office Action mailed Jun. 10, 2011, 15 pages.

U.S. Appl. No. 12/534,819, Non-Final Office Action mailed Oct. 4, 2011, 13 pages.

U.S. Appl. No. 12/534,819, Final Office Action mailed Mar. 15, 2012, 17 pages.

U.S. Appl. No. 12/534,819, Final Office Action mailed Jun. 4, 2012, 14 pages.

* cited by examiner

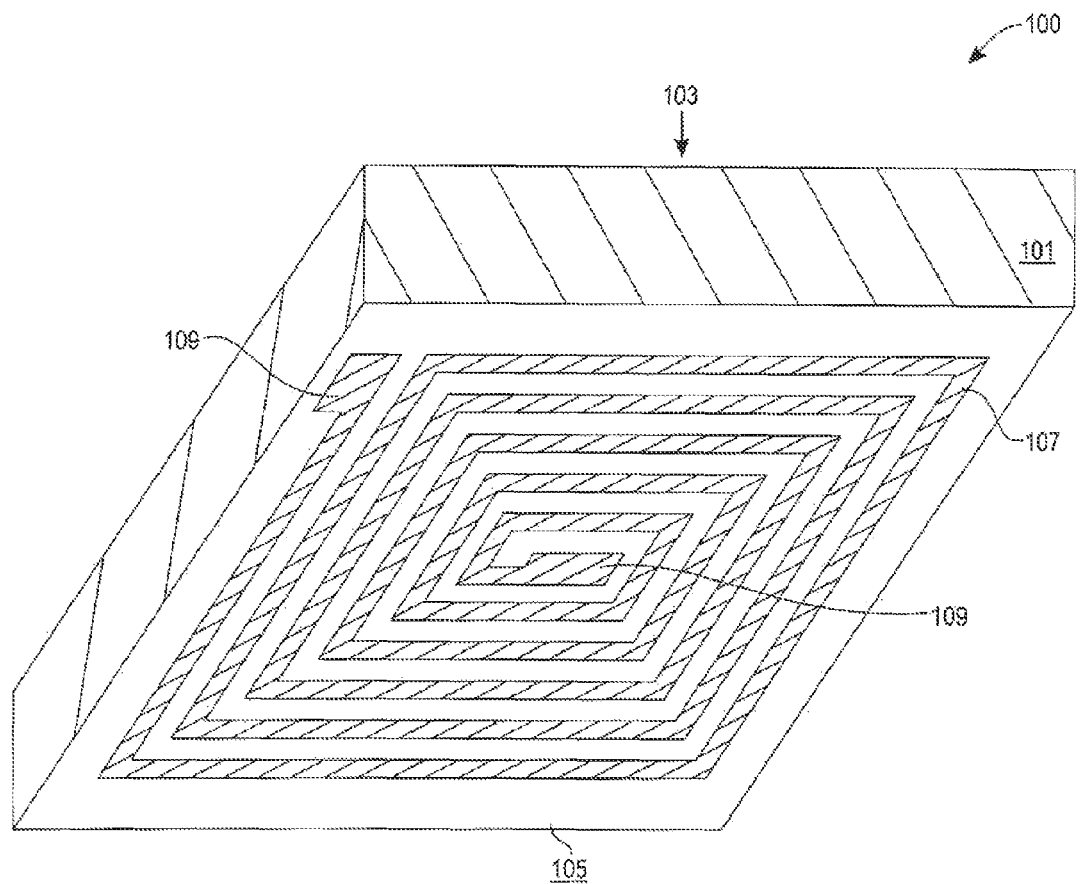
Fig._1
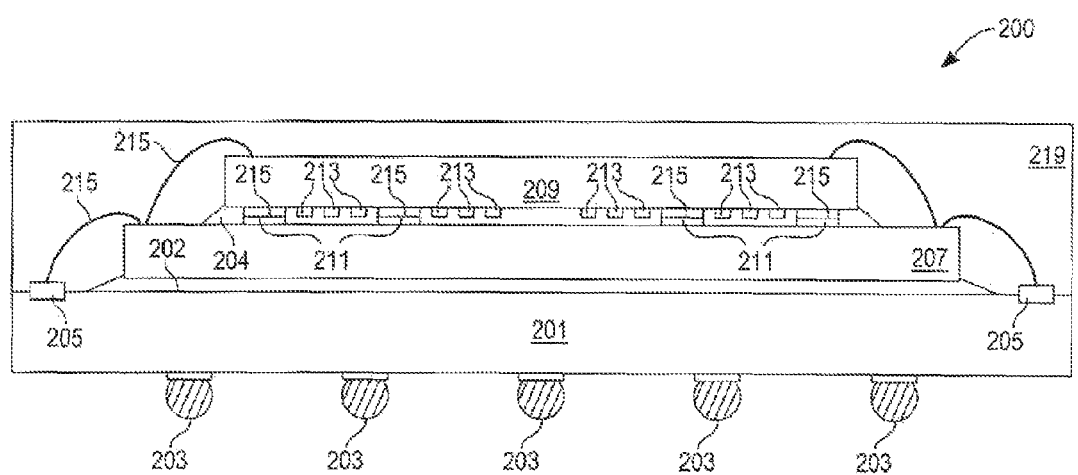
Fig._2

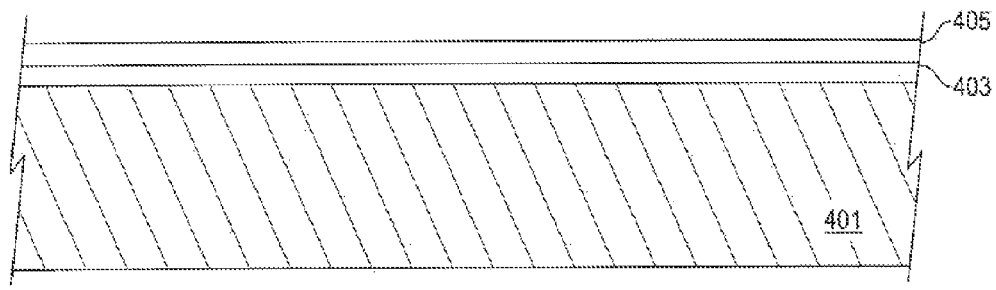
Fig._4A
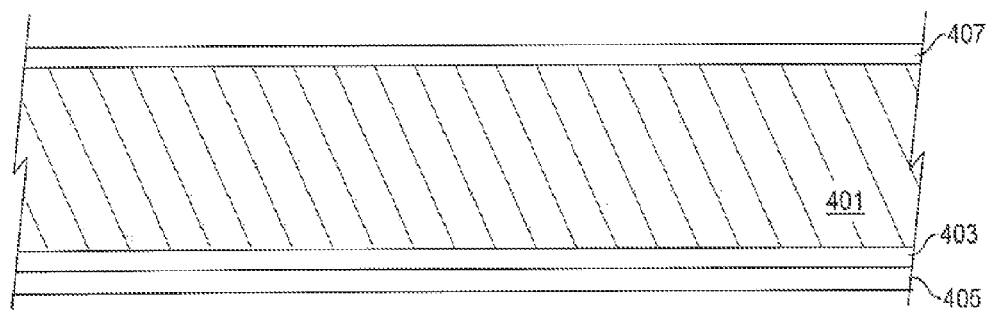
Fig._4B
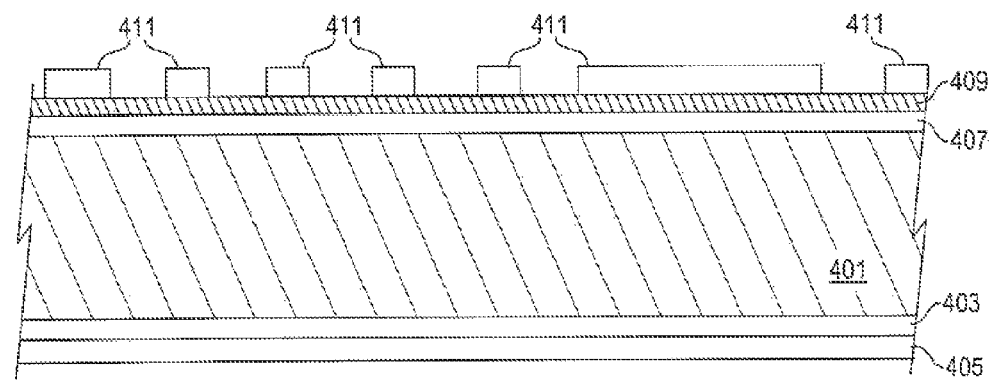
Fig._4C

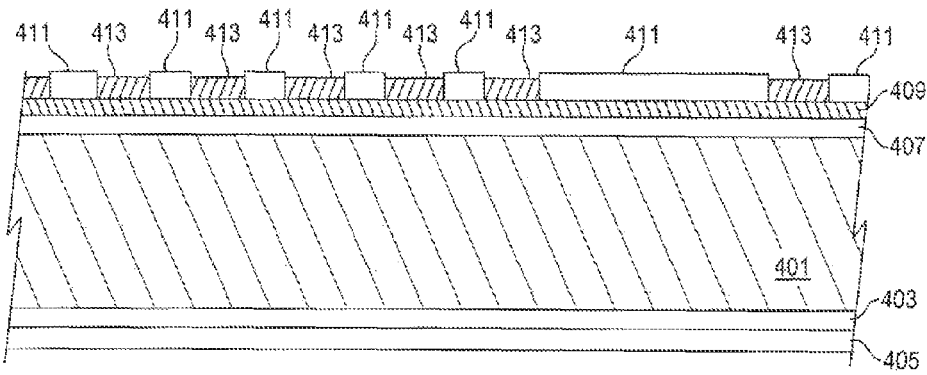
Fig._4D
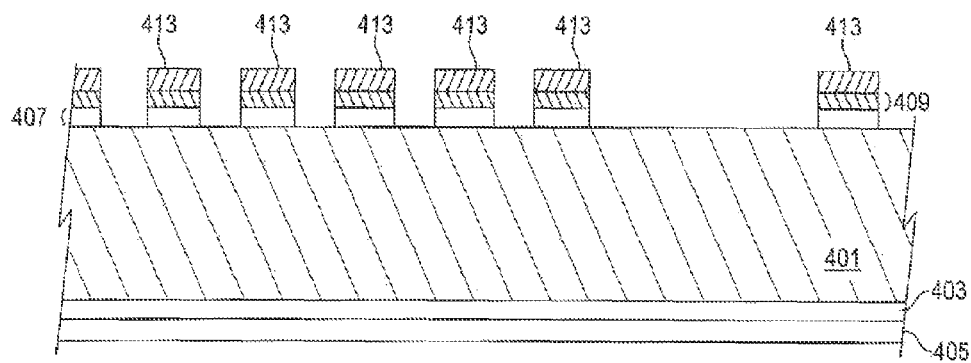
Fig._4E
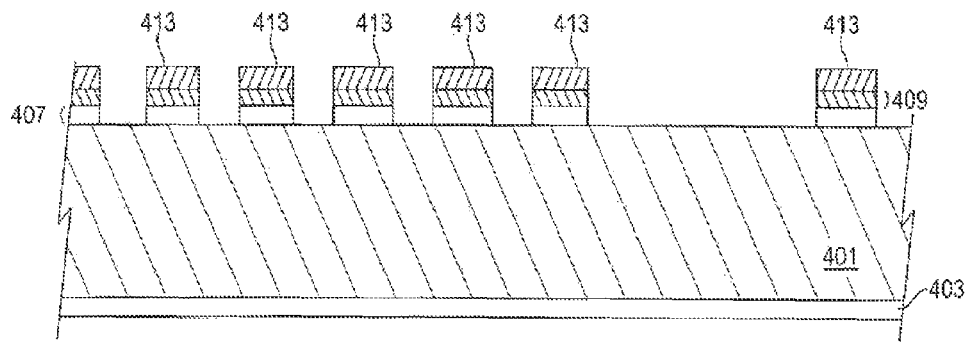
Fig._4F

STACKED-DIE ELECTRONICS PACKAGE WITH PLANAR AND THREE-DIMENSIONAL INDUCTOR ELEMENTS

CROSS-REFERENCE TO RELATED APPLICATIONS

This application is a divisional of and claims priority to U.S. application Ser. No. 11/457,409, entitled "A Stacked-Die Electronics Package with Planar and Three-Dimensional Inductor Elements," filed Jul. 13, 2006, to issue as U.S. Pat. No. 7,932,590 on Apr. 26, 2011, the entire contents of which are hereby incorporated by reference.

The following U.S. patent application is relied upon and is incorporated by reference in its entirety in this application: U.S. patent application Ser. No. 11/456,685 filed Jul. 11, 2006.

TECHNICAL FIELD

The invention relates to an integrated circuit package, and more particularly, to incorporating passive components on a back side of a substrate having a fabricated integrated circuit device.

BACKGROUND ART

As electronic packages increase in both required functionality and the number of functions an electronic package is expected to perform, passive components are frequently needed to accomplish specific circuit tuning. Circuit tuning either adds tunable characteristics to the package or enables the package to perform properly. Enabling proper performance is especially required in many radio-frequency (RF) applications. For example, high-Q inductors are frequently needed in RF applications.

Adding discrete passive components to electronic packages typically results in an increase in both the size and weight of the package. These increases counter contemporary goals of increased portability and miniaturization. Adding discrete passive components in electronic packages also requires a dedicated production line, frequently including surface mounting equipment and added process setups. The added equipment and processes increase both capital investment and assembly lead-time, resulting in higher product costs.

Currently, these problems are being addressed by fabricating passive components, (e.g., inductors, capacitors, and resistors) over the active circuitry of an integrated circuit device. Integrating passive components requires various fabrication methods such as thin-film, photolithographic, and plating processes. Vias are formed over a top passivation layer of an integrated circuit device thus allowing integrated passive components to connect to the underlying integrated circuitry elements.

Consequently, current solutions for adding passive components to an integrated circuit device require custom-designed contact via openings to be at the top passivation layer for each product device. If a product is not initially designed to accept passive components, they cannot be simply added to the device. Therefore, what is need is a simple, inexpensive, and reliable means to add passive components to any integrated circuit without requiring, for example, custom designed contact vias or precise photolithography.

SUMMARY

In an exemplary embodiment, the present invention is an integrated circuit device with a first substrate and a second substrate. The first substrate has a front side having one or more integrated circuit devices and a plurality of bond pads fabricated on its surface. The second substrate has a smaller area than the first substrate. The front side of the second substrate has one or more integrated circuit devices fabricated on its surface. At least one passive component is fabricated onto a back side of the second substrate. An electrical conductor allows electrical communications between the at least one passive component of the second substrate and at least one of the one or more integrated circuit devices of the first substrate.

In another exemplary embodiment, the present invention is an integrated circuit device with a first substrate and a second substrate. The first substrate has a front side with one or more integrated circuit devices and a plurality of bond pads fabricated on its surface. The second substrate has a smaller area than the first substrate. A front side of the second substrate has one or more integrated circuit devices fabricated on its surface. A first portion of at least one passive component is fabricated onto a back side of the second substrate. A second portion of at least one passive component is fabricated onto the front side of the first substrate, the second portion of the at least one passive component is formed so as to mirror the first portion. An electrical conductor allows electrical communications between the two portions of the at least one passive component.

In another exemplary embodiment, the present invention is a method of forming one or more passive components on a plurality of substrates. The method includes selecting a first substrate and a second substrate such that an area of the second substrate is less than an area of the first substrate, forming at least one integrated circuit on a front side of each of the first and second substrates, forming a plurality of bond pads on the front side of the first substrate, and forming a photoresist layer over a back side of the second substrate. The photoresist layer is then patterned and etched to form one or more passive component structures on the back side of the second substrate. The etched areas are filled with a metal and the one or more passive component structures are electrically bonded to selected ones of the plurality of bond pads.

In another exemplary embodiment, the present invention is a method of forming one or more passive components on a plurality of substrates where the method includes selecting a first substrate and a second substrate such that an area of the second substrate is less than an area of the first substrate, forming at least one integrated circuit on a front side of each of the first and second substrates, and forming a plurality of bond pads on the front side of the first substrate. A first portion of at least one passive component structure is formed on a back side of the second substrate. A second portion of at least one passive component structure is formed over the at least one integrated circuit on the front side of the first substrate where the second portion being a mirror image of the first portion. The first and second portions of the at least one passive component structure are then electrically bonded.

BRIEF DESCRIPTION OF THE DRAWINGS

FIG. 1 is an isometric drawing of a passive element fabricated on a back side of an integrated circuit substrate in accordance with an exemplary embodiment of the present invention.

FIG. 2 illustrates integrated circuit dice fabricated in accordance with an exemplary method of the present invention and mounted in a ball grid array (BGA) package.

FIGS. 4A-4F are exemplary fabrication steps of an integrated circuit device produced in accordance with the present invention.

DETAILED DESCRIPTION

Figure 3A:
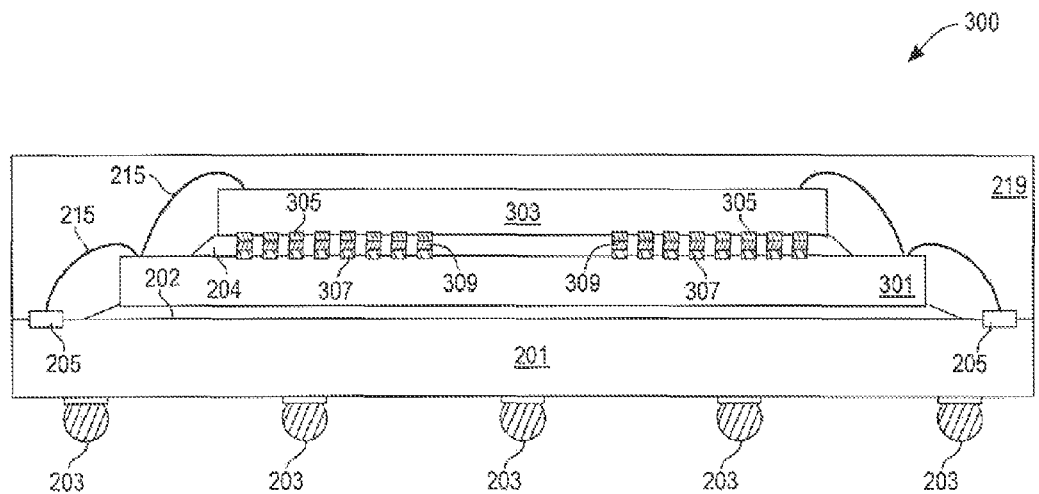
FIG. 3A illustrates integrated circuit dice fabricated in accordance with another exemplary method of the present invention and mounted in a ball grid array (BGA) package.

In FIG. 1, an integrated circuit die 100 includes a substrate 101 having a front side 103 and a back side 105. In a specific exemplary embodiment, the substrate 101 is portion of a silicon wafer. However, a skilled artisan will recognize that other semiconducting and non-semiconducting materials may be used instead of silicon for the substrate 101. Other semiconducting materials include, for example, elemental semiconductors such as germanium, compound semiconductors such as group III-V, and II-VI materials, and semiconducting alloys (e.g., $Al_xGa_{1-x}As$, $HG_{1-x}CD_xTe$). Additionally, non-semiconducting materials such as, for example, a polyethylene-terephthalate (PET) substrate deposited with silicon dioxide or a quartz photomask, each of which may be deposited with polysilicon followed by an excimer laser annealing (EDA) anneal step.

On the back side 105 of the substrate 101, one or more passive components are formed. In this exemplary embodiment, a large single inductor 107 is formed. The inductor 107 terminates with a bond pad 109 on either end. Techniques disclosed herein apply readily to various types of passive components (e.g., inductors, resistors, capacitors, etc.). The passive components may be fabricated individually or in various combinations and with varying sizes. FIG. 1 therefore should be viewed as merely illustrative only of a generalized concept to be described in greater detail below.

With reference to FIG. 2, a stacked-die ball grid array (BGA) package 200 includes a BGA substrate 201 and a plurality of BGA balls 203. The BGA package type is generally known in the art. Mounted to the BGA substrate 201 is a first integrated circuit die 207 fabricated in accordance with methods known in the art. There is a plurality of contact vias 211 fabricated on the front side of the first integrated circuit die 207.

A second integrated circuit die 209 fabricated in accordance with an exemplary embodiment of the present invention is mounted on top of the first integrated circuit die 207. The first integrated circuit die is mounted to the BGA substrate with a first adhesive 202. The second integrated circuit die 209 is mounted to the front side of the first integrated circuit die with a second adhesive 204. The first and second adhesives 202, 204 may be, for example, various types of electrically or non-electrically-conductive tape or epoxy.

One or more passive components 213 are fabricated on the back side of the second integrated circuit die 209. Each of the one or more passive components 213 has an associated plurality of passive component bond pads 215. The plurality of passive component bond pads 215 is also fabricated on the back side of the second integrated circuit die 209. In a specific exemplary embodiment, the one or more passive components 213 is an inductor. Each inductor will therefore have at least two associated bond pads. If an electrically-conductive tape or epoxy is used for the second adhesive 204, it must be insulated from the one or more passive components 213 and the associated plurality of passive component bond pads 215 so as to not electrically short either the components or pads.

Electrical connections are made from the one or more passive components 213 through the plurality of passive component bond pads 215 to the plurality of contact vias 211. Electrical communication occurs between the one or more passive components 213 on the second integrated circuit die 209 and the plurality of contact vias 211 on the first integrated circuit die 211 through, for example, conductive epoxy, solder, conductive polymers, metal-to-metal bonding, etc.

Integrated circuit devices (not shown) are fabricated on the front side of each the first and second integrated circuit dice 207, 209. A plurality of bond wires 215 connect the front side integrated circuit devices to the BGA substrate 201. The BGA substrate 201 and the integrated circuit dice 207, 209 are protected with an encapsulant 219.

In FIG. 3A, a stacked-die ball grid array (BGA) package 300 includes a first integrated circuit die 301 and a second integrated circuit die 303. The first and second integrated circuit dice 301, 303 each are fabricated with a portion of an inductor 305, 307. An inductor first portion 307 is fabricated on the front side of the first integrated circuit die 301. An inductor second portion 305 is fabricated on the back side of the second integrated circuit die 303. Details of exemplary techniques for fabricating the inductor portions 305, 307 are disclosed below.

Mounting the first and second integrated circuit dice 301, 303 brings the two inductor portions 305, 307 in proximity to each other. An interconnecting material 309 forms an electrical connection between the two portions 305, 307 of the inductor. Thus, a complete inductor is formed. The interconnecting material may be comprised of, for example, solder, metal-to-metal bonding, electrically-conductive polymer, or various other bonding techniques known in the art.

Figure 3B:
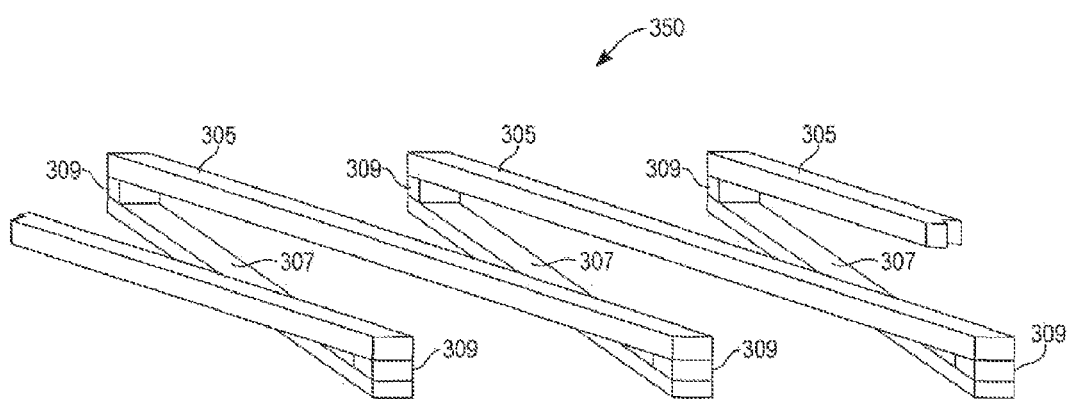
FIG. 3B is a detail drawing of an inductor formed in portions on different integrated circuit dice.

With reference to FIG. 3B, a formed inductor 350 is shown independent of the first and second integrated circuit dice 301, 303 (FIG. 3A) to enhance clarity. The inductor first portion 305 is formed into the back side of the second integrated circuit die 303 (not shown) to mirror the inductor second portion 307 formed into the front side of the first integrated circuit die 301 (not shown). The interconnecting material 309 electrically connects the two inductor portions 305, 307 together. One of skill in the art will recognize that the inductance value of the formed inductor 350 may be tuned depending upon a choice of adhesive 204 (FIGS. 2 and 3A) or other material selected for adhering the first and second integrated circuit dice 301, 303. Fabrication techniques for forming the inductor portions 305, 307 are described below.

Exemplary fabrication steps for producing integrated circuit dice according to various embodiments of the present invention are presented graphically with reference to FIGS. 4A-4F. Using the techniques disclosed, integrated passive components may be readily produced using, for example, thin-film and plating techniques on the back side of a substrate (such as, for example, a silicon wafer). The substrate is then singulated into individual dice. An integrated circuit device is formed using traditional fabrication techniques on a front side of the substrate. Integrated passive components are then fabricated on the back side of the substrate. (In the case of an inductor fabricated on the front side of an integrated circuit die (e.g., the inductor first portion 307, FIGS. 3A and 3B), process steps are nearly identical and will be referenced as needed.)

In FIG. 4A, the substrate 401 has integrated circuit devices 403 fabricated upon the front side of the substrate 401. The integrated circuit devices 403 are optionally covered with a temporary coating 405. The temporary coating 405 protects the integrated circuit devices 403 for later processing steps which occur on the back side of the substrate 401. The temporary coating 405 may be, for example, an organic or metallic coating (e.g., photoresist or a deposited or sputtered metal layer). (A temporary coating may not be needed if fabricating an inductor first portion on the front side of a die. Alternatively, a nitride or other dielectric film passivation layer may be added over the integrated circuit components prior to fabricating the inductor.)

In FIG. 4B, an optional dielectric material 407 is formed on the back side of the substrate 401. The optional dielectric material may be either an organic or inorganic material. In a specific exemplary embodiment, the optional dielectric material 407 is a high-k dielectric material (e.g., zirconium-doped tantalum oxide, zirconium oxide, tantalum pentoxide, etc.). A high-k dielectric layer increases the Q-factor of an inductor. (The nitride or other dielectric film passivation layer disclosed above may be used as the optional dielectric material 407 if fabricating an inductor first portion on the front side of a die.)

With reference to FIG. 4C, a metal seed layer 409 is applied to either the back side of the substrate 401 or to the optional dielectric material 407. The metal seed layer 409 forms a seed metal layer for additional layers. The metal seed layer 409 may be, for example, an electrolytically plated metal layers such as a titanium-tungsten-copper (TiW—Cu) layer. Skilled artisans will recognize that other metals may be selected. The metal seed layer 409 is then coated with photoresist. Various passive components may be patterned and etched leaving an etched photoresist layer 411.

In FIG. 4D, a metal deposition 413 deposits metal into the open areas in the etched photoresist layer 411 thus forming a metal structure. The metal deposition 413 may be, for example, an electroplated layer comprised substantially of copper. Other techniques for forming one or more metal layers, for example, sputtering, may also be used. Additionally, other metals may be chosen so as to affect electrical characteristics of the passive component. For example, a metal having low conductivity may be used for forming resistive elements. Also, a combination of various metal types or metal alloys may be used in different geometric areas. A skilled artisan will recognize that certain types of metal may not require the metal seed layer 409. In these cases, a patterned photoresist 411 may be applied directly to the back side of the substrate 401 and metal applied (e.g., deposited, sputtered, etc.) without a need for either the optional dielectric material 407 or the metal seed layer 409. The choice of layers is dependent upon factors such as metal choice and metal-forming methods employed.

In FIG. 4E, the photoresist layer 411 may be stripped and exposed portions of the metal seed layer 409, if used, are etched. Alternatively, the photoresist layer 411 may simply be left in place. If present, exposed portions of the optional dielectric material 407 are also removed. The temporary coating 405 (FIGS. 4A-4E) is removed as illustrated in FIG. 4F.

All fabrication operations disclosed herein may be carried out at the substrate (e.g., wafer) level prior to singulation of individual dice formed before package assembly. Electrical connections can be achieved by joining appropriate areas with, for example, solder, conductive polymer, or metal-to-metal bonding processes. An optional polymer material, such as epoxy or acrylic, can be used to fill any gaps between the individual die and the substrate of the packaging device to assist in further anchoring the integrated circuit device to the package substrate. The integrated circuit device will then undergo a standard wire bonding process to connect bond pads on the individual die to the package substrate.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that embodiments of the present invention may be readily used in various types of semiconductor packaging such as Quad Flat-Pack No-Lead (QFN), Dual Flat-Pack No-Lead (DFN), QTAPP® (thin array plastic package), ULGA® (ultra-thin land grid array), BCC® (bumped chip carrier), or other package types. The specification and drawings are, accordingly, to be regarded in an illustrative rather than a restrictive sense.

What is claimed is:

1. A method of forming one or more passive components on a plurality of substrates, the method comprising:
   selecting a first substrate and a second substrate such that an area of the second substrate is less than an area of the first substrates;
   forming at least one integrated circuit on a front side of each of the first and second substrates;
   forming a plurality of bond pads on the front side of the first substrate;
   forming a photoresist layer over a back side of the second substrate;
   patterning and etching the photoresist layer to form one or more passive component structures on the back side of the second substrate;
   filling the etched areas of the patterned and etched photoresist with a metal; and
   electrically bonding the one or more passive component structures to selected ones of the plurality of bond pads.

2. The method of claim 1 further comprising:
   bonding the back side of the second substrate to the front side of the first substrate;
   mounting both the first and second substrates into a semiconductor package;
   forming wire bonds from at least one of the two substrates to the semiconductor package; and
   forming an encapsulant over the first and second substrates and the plurality of wire bonds.

3. The method of claim 1 further comprising removing substantially all of the remaining etched and patterned photoresist layer.

4. The method of claim 1 further comprising forming a dielectric layer over the back side of the second substrate prior to forming the photoresist layer.

5. The method of claim 1 further comprising forming a protective coating over the at least one integrated circuit of the second substrate prior to forming the photoresist layer over the back side of the second substrate.

6. The method of claim 1 further comprising forming a metal seed layer over the back side of the second substrate prior to forming the photoresist layer.

7. The method of claim 1 further comprising:
   forming a dielectric layer over the back side of the second substrate; and
   forming a metal seed layer over the dielectric layer prior to forming the photoresist layer.

8. The method of claim 4 further comprising selecting the dielectric layer to be comprised of a high-k dielectric material.

9. A method of forming one or more passive components on a plurality of substrates, the method comprising:
   selecting a first substrate and a second substrate such that an area of the second substrate is less than an area of the first substrate;

forming at least one integrated circuit on a front side of each of the first and second substrates;

forming a plurality of bond pads on the front side of the first substrate;

forming a first portion of at least one passive component structure on a back side of the second substrate;

forming a second portion of at least one passive component structure over the at least one integrated circuit on the front side of the first substrate, the second portion being a mirror image of the first portion; and electrically bonding the first and second portions of the at least on passive component structure.

10. The method of claim 9 further comprising:

forming a photoresist layer over the back side of the second substrate and the front side of the first substrate;

patterning and etching each of the photoresist layers to form the first and second portions of the one or more passive component structures; and filling the etched areas of the patterned and etched photoresist layers with a metal.

11. The method of claim 9 further comprising:

bonding the back side of the second substrate to the front side of the first substrate;

mounting both the first and second substrates into a semiconductor package;

forming wire bonds from at least one of the two substrates to the semiconductor package; and forming an encapsulant over the first and second substrates and the plurality of wire bonds.

12. The method of claim 10 further comprising removing substantially all of the remaining etched and patterned photoresist layers.

13. The method of claim 10 further comprising forming a dielectric layer over each of the back side of the second substrate and the front side if the first substrate prior to forming the photoresist layers.

14. The method of claim 10 further comprising forming a protective coating over the at least one integrated circuit of the second substrate prior to forming the photoresist layer over the back side of the second substrate.

15. The method of claim 10 further comprising forming a metal seed layer over each of the back side of the second substrate and the front side of the first substrate prior to forming the photoresist layers.

16. The method of claim 10 further comprising:

forming a dielectric layer over each of the back side of the second substrate and the front side of the first substrate; and forming a metal seed layer over each of the dielectric layers prior to forming the photoresist layers.

17. The method of claim 13 further comprising selecting the dielectric layers to be comprised of a high-k dielectric material.

* * * * *